(12) United States Patent
Hwang

(10) Patent No.: US 8,686,763 B2
(45) Date of Patent: Apr. 1, 2014

(54) RECEIVER CIRCUIT

(75) Inventor: Tae Jin Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,260

(22) Filed: Sep. 3, 2012

(65) Prior Publication Data

US 2013/0194014 A1    Aug. 1, 2013

(30) Foreign Application Priority Data

Jan. 31, 2012   (KR) .................. 10-2012-0009983

(51) Int. Cl.
*H03B 1/00*       (2006.01)
*H03K 3/00*       (2006.01)

(52) U.S. Cl.
USPC ......................................... 327/108; 327/112

(58) Field of Classification Search
USPC .................................................. 327/108, 112
See application file for complete search history.

(56) References Cited

U.S. PATENT DOCUMENTS

| | | | |
|---|---|---|---|
| 6,292,015 B1 * | 9/2001 | Ooishi et al. ..................... 326/33 |
| 6,307,401 B1 | 10/2001 | Bridgewater, Jr. |
| 6,496,049 B2 * | 12/2002 | Tsukagoshi et al. .......... 327/322 |
| 7,557,620 B2 | 7/2009 | Pan |
| 2009/0080570 A1 | 3/2009 | Dubey |

* cited by examiner

*Primary Examiner* — Hai L Nguyen
(74) *Attorney, Agent, or Firm* — William Park & Associates Patent Ltd.

(57) ABSTRACT

A receiver circuit includes a buffering unit configured to buffer an input signal and generate a buffering signal; a variation detection unit configured to generate a control signal according to a level of a reference voltage; a driving unit configured to drive the buffering signal and generate an output signal; and a compensation unit configured to control a slew rate of the output signal in response to the control signal.

18 Claims, 3 Drawing Sheets

US 8,686,763 B2

RECEIVER CIRCUIT

CROSS-REFERENCES TO RELATED APPLICATION

The present application claims priority under 35 U.S.C. §119(a) to Korean application number 10-2012-0009983, filed on Jan. 31, 2012, in the Korean Intellectual Property Office, which is incorporated herein by reference in its entirety.

BACKGROUND

1. Technical Field

The present invention relates to a semiconductor integrated circuit, and more particularly, to a receiver circuit.

2. Related Art

FIG. 1 shows a conventional receiver circuit which is used in is a semiconductor integrated circuit.

The conventional receiver circuit includes a buffering unit 10, and a driver 20.

The buffering unit 10 compares the level of a reference voltage Vref and the voltage level of an input signal IN, and generates a buffering signal Bf_s.

The driver 20 drives the buffering signal Bf_s and outputs an output signal OUT.

In the conventional receiver circuit, the duty of the output signal OUT may change according to a variation in PVT (process, voltage and temperature). In detail, if the voltage level of the output of the buffer unit 10, that is, the buffering signal Bf_s, changes according to a process variation, a voltage variation or a temperature variation, since the driver 20 drives and outputs the buffering signal Bf_s, the duty of the final output signal OUT of the receiver circuit 10 will be to output Bf_S with changes according to the variation in PVT.

SUMMARY

In one embodiment of the present invention, a receiver circuit includes: a buffering unit configured to buffer an input signal and generate a buffering signal; a variation detection unit configured to generate a control signal according to a level of a reference voltage; a driving unit configured to drive the buffering signal and generate an output signal; and a compensation unit configured to control a slew rate of the output signal in response to the control is signal.

In another embodiment of the present invention, a receiver circuit includes: a buffering unit configured to buffer an input signal of a CML (current mode logic) level and generate a buffering signal; a driving unit configured to drive the buffering signal and generate an output signal of a CMOS (complementary metal-oxide semiconductor) level; and a variation compensation block having a modeling buffering section which is configured in a similar way as the buffering unit, and configured to increase or decrease a slew rate of the output signal in response to an output of the modeling buffering section.

In another embodiment of the present invention, a receiver circuit includes: a buffering unit configured to buffer an input signal and generate a buffering signal; a driving unit configured to pull down an output node when a voltage level of the buffering signal is equal to or higher than a preset voltage level, and pull up the output node when the voltage level of the buffering signal is equal to or lower than the preset voltage level; and a variation compensation block having a modeling buffering section which is configured in a similar way as the buffering unit, and configured to control a pull-down driving force of the output node in response to an output of the modeling buffering section.

BRIEF DESCRIPTION OF THE DRAWINGS

Features, aspects, and embodiments are described in conjunction with the attached drawings, in which.

DETAILED DESCRIPTION

Hereinafter, a receiver circuit according to the present invention will be described below with reference to the accompanying drawings through various embodiments.

Figure 2:
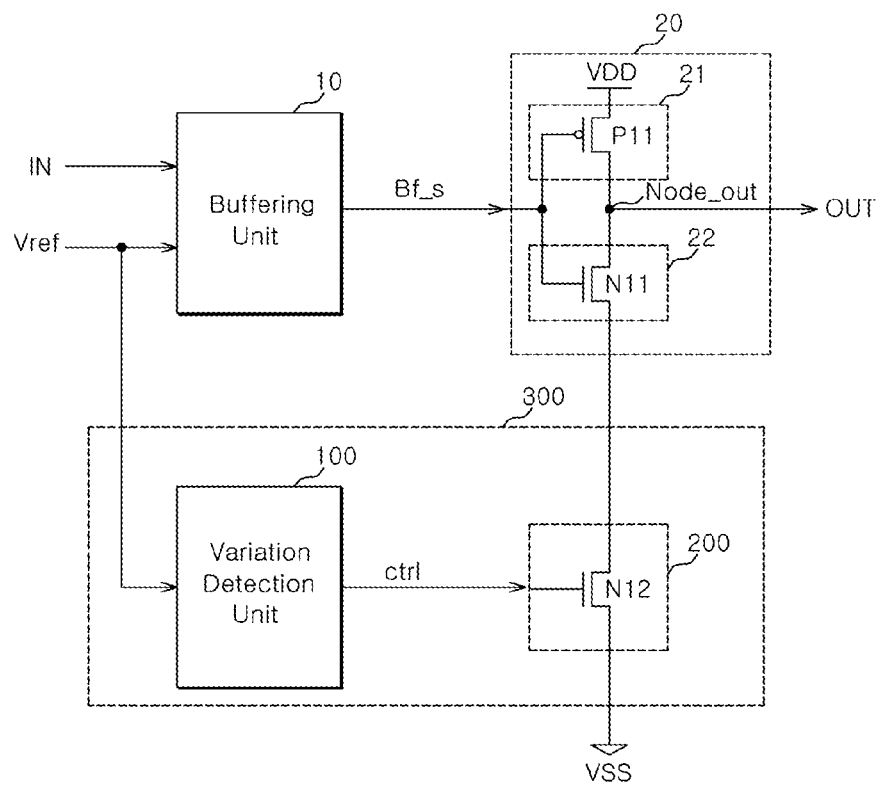
FIG. 2 is a configuration diagram of a receiver circuit in accordance with an embodiment of the present invention.

Referring to FIG. 2, a receiver circuit in accordance with an embodiment of the present invention includes a buffering unit 10, a driving unit 20, and a variation compensation block 300.

The buffering unit 10 is configured to buffer an input signal IN of a CML (current mode logic) level and generate a buffering signal Bf_s. For example, the buffering unit 10 compares the level of the input signal IN and the level of a reference voltage Vref and determines the voltage level of the buffering signal Bf_s.

The driving unit 20 is configured to drive the buffering signal Bf_s and generate an output signal OUT of a CMOS (complementary is metal-oxide semiconductor) level. For example, the driving unit 20 pulls down an output node Node_out when the voltage level of the buffering signal Bf_s is equal to or higher than a preset voltage level, and pulls up the output node Node_out when the voltage level of the buffering signal Bf_s is equal to or lower than the preset voltage level.

The driving unit 20 includes a pull-up section 21 and a pull-down section 22.

The pull-up section 21 is configured to pull up the output node Node_out in response to the voltage level of the buffering signal Bf_s.

The pull-up section 21 includes a first transistor P11. The first transistor P11 has a gate which is inputted with the buffering signal Bf_s, a source which is applied with an external voltage VDD, and a drain to which the output node Node_out is connected.

The pull-down section 22 is configured to pull down the output node Node_out in response to the voltage level of the buffering signal Bf_s.

The pull-down section 22 includes a second transistor N11. The second transistor N11 has a gate which is inputted with the buffering signal Bf_s, a drain to which the output node Node_out is connected, and a source which is connected to a compensation unit 200 of the variation compensation block 300. The node to which the first transistor P11 and the second transistor N11 are connected is the output node Node_out, and an output signal OUT is outputted from the output node Node_out.

The variation compensation block 300 has a modeling buffering section 110 (see FIG. 3) which is configured in a similar way as the buffering unit 10, and is configured to increase or decrease the slew rate of the output signal OUT in response to the output of the modeling buffering section 110. For example, the variation compensation block 300 controls the pull-down driving force of the output node Node_out, that is, the pull-down driving force of the pull-down section 22, in response to the output of the modeling buffering section 110 which is configured in a similar way as the buffering unit 10.

The variation compensation block 300 includes a variation detection unit 100, and the compensation unit 200.

The variation detection unit 100 is configured to compare the output level of the modeling buffering section 110 (see FIG. 3) and the level of an external voltage and generate a control signal ctrl. For example, the variation detection unit 100 generates a detection signal Det_v (see FIG. 3) in response to a level difference between the reference voltage Vref and a ground voltage VSS, compares the voltage level of the detection signal Det_v and the level of a divided voltage V_div acquired by voltage-dividing the external voltage VDD, and generates the control signal ctrl. Therefore, it may be mentioned that the variation detection unit 100 generates the control signal ctrl in response to the level difference between the reference voltage Vref and the ground voltage VSS. Also, it may be mentioned that the variation detection unit 100 generates the control signal ctrl is according to the level of the reference voltage Vref.

The compensation unit 200 is configured to control the slew rate of the output signal OUT in response to the control signal ctrl. For example, the compensation unit 200 determines an amount of current which flows from the driving unit 20 to a ground terminal VSS, in response to the control signal ctrl. In detail, the compensation unit 200 controls the pull-down driving force of the pull-down section 22 of the driving unit 20 in response to the control signal ctrl.

The compensation unit 200 controls an amount of current which flows from the pull-down section 22 to the ground terminal VSS.

The compensation unit 200 includes a third transistor N12. The third transistor N12 has a gate which is inputted with the control signal ctrl, a drain to which the source of the second transistor N11 of the pull-down section 22 is connected, and a source to which the ground terminal VSS is connected.

Figure 3:
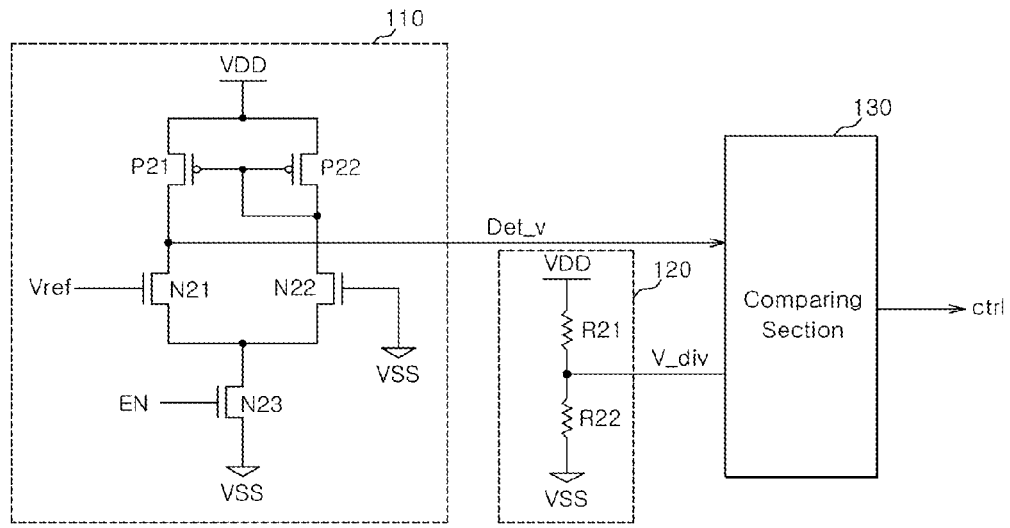
FIG. 3 is a configuration diagram of the variation detection unit of FIG. 2.

Referring to FIG. 3, the variation detection unit 100 includes the modeling buffering section 110, a voltage dividing section 120, and a comparing section 130.

The modeling buffering section 110 is configured in a similar way as the buffering unit shown in FIG. 2. The modeling buffering section 110 is configured to buffer the reference voltage Vref and generate the detection signal Det_v. In detail, the modeling buffering section 110 compares the levels of the reference voltage Vref and the ground voltage VSS and generates the detection signal Det_v. That is to say, the modeling buffering section 110 generates the detection signal Det_v in response to the voltage level difference between the reference voltage Vref and the ground voltage VSS.

The modeling buffering section 110 includes fourth to eighth transistors P21, P22, N21, N22 and N23. The fourth transistor P21 has a source which is applied with the external voltage VDD. The fifth transistor P22 has a gate and a drain to which the gate of the fourth transistor P21 is connected, and a source which is applied with the external voltage VDD. The sixth transistor N21 has a gate which is applied with the reference voltage Vref and a drain to which the drain of the fourth transistor P21 is connected. The seventh transistor N22 has a gate to which the ground voltage VSS is applied and a drain to which the drain of the fifth transistor P22 is connected. The eighth transistor N23 has a gate to which an enable signal EN is inputted, a drain to which a node connected with the sources of the sixth and seventh transistors N21 and N22 is connected, and a source which is applied with the ground voltage VSS. The detection signal Det_v is outputted from a node to which the drains of the fourth and sixth transistors P21 and N21 are connected.

The voltage dividing section 120 is configured to voltage-divide the external voltage VDD and generate a divided voltage V_div. For example, the voltage dividing section 120 makes the level of the divided voltage V_div correspond to ½ of the level of the external voltage VDD.

The voltage dividing section 120 includes first and second resistors R21 and R22. The first resistor R21 has one end which is applied with the external voltage VDD. The second resistor R22 has one end to which the other end of the first resistor R21 is connected and the other end to which the ground terminal VSS is connected. The divided voltage V_div is outputted from a node to which the first and second resistors R21 and R22 are connected.

The comparing section 130 is configured to compare the voltage level of the detection signal Det_v and the level of the divided voltage V_div and generate the control signal ctrl.

The receiver circuit in accordance with the embodiment of the present invention, configured as mentioned above, operates as follows.

The buffering unit 10 shown in FIG. 2 is configured in a similar way as the modeling buffering section 110 shown in FIG. 3.

If the voltage level of the buffering signal Bf_s of the buffering unit 10 changes according to a variation in PVT (process, voltage and temperature), the output of the modeling buffering section 110 configured in a similar way as the buffering unit 10, that is, the voltage level of the detection signal Det_v changes.

For example, if the voltage level of the buffering signal Bf_s as the output of the buffering unit 10 decreases according to a variation in PVT, the voltage level of the detection signal Det_v as the output of the modeling buffering section 110 decreases.

If the voltage level of the detection signal Det_v decreases to be lower than the level of the divided voltage V_div as the output of the voltage dividing section 120, the comparing section 130 raises the voltage level of the control signal ctrl.

If the voltage level of the control signal ctrl is raised, an amount of current which flows from the driving unit 20 to the ground terminal VSS increases.

In other words, in the case where the voltage level of the buffering signal Bf_s as the output of the buffering unit 10 decreases due to a variation in PVT so the driving force of a pull-up operation of the driving unit 20 becomes larger than the driving force of a pull-down operation of the driving unit 20, the voltage level of the control signal ctrl is raised so the compensation unit 200 increases the pull-down driving force of the driving unit 20.

Figure 1:
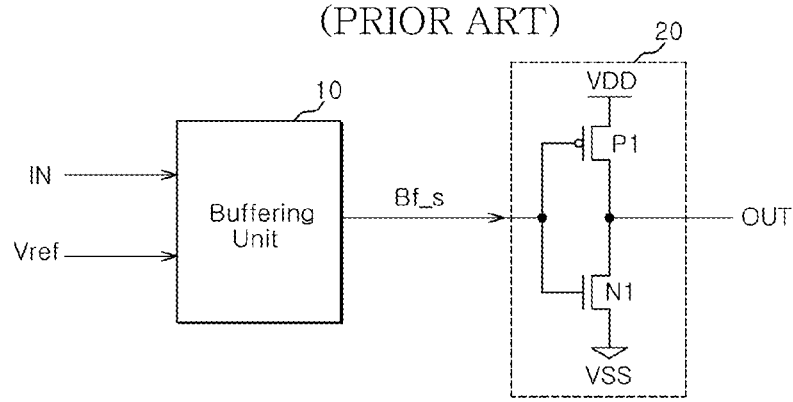
FIG. 1 is a configuration diagram of a conventional receiver circuit.

In the conventional receiver circuit shown in FIG. 1, if the level of the output voltage of the buffering unit 10 decreases according to a variation in PVT, the driving force of a pull-up operation of the driving unit 20 becomes larger than the driving force of a pull-down operation of the driving unit 20. Therefore, the output signal OUT cannot have normal duty. However, in the receiver circuit in accordance with the embodiment of the present invention, in the case where the voltage level of the buffering signal Bf_s as the output of the buffering unit 10 decreases due to a variation in PVT so the driving force of the pull-up operation of the driving unit 20 becomes larger than the driving force of the pull-down operation of the driving unit 20, the voltage level of the control signal ctrl is raised so the compensation unit 200 increases the pull-down driving force of the driving unit 20. Therefore, since the driving unit 20 has the pull-up driving force and the pull-down driving force of the same magnitude, the output of the receiver circuit in accordance with the embodiment of the present invention may have normal duty, that is, a normal slew rate.

Further, for example, if the voltage level of the buffering signal Bf_s as the output of the buffering unit 10 increases due to a variation in PVT, the voltage level of the detection signal Det_v as the output of the modeling buffering section 110 increases.

If the voltage level of the detection signal Det_v increases to be higher than the divided voltage V_div as the output of the voltage dividing section 120, the comparing section 130 lowers the voltage level of the control signal ctrl.

If the voltage level of the control signal ctrl is lowered, an amount of current which flows from the driving unit 20 to the ground terminal VSS decreases.

In other words, in the case where the voltage level of the buffering signal Bf_s as the output of the buffering unit 10 increases so the driving force of the pull-down operation of the driving unit 20 becomes larger than the driving force of the pull-up operation of the driving unit 20, the voltage level of the control signal ctrl is lowered so the compensation unit 200 decreases the pull-down driving force of the driving unit 20.

In the conventional receiver circuit shown in FIG. 1, if the level of the output voltage of the buffering unit 10 increases is according to a variation in PVT, the driving force of a pull-down operation of the driving unit 20 becomes larger than the driving force of a pull-up operation of the driving unit 20. Therefore, the output signal OUT cannot have normal duty. However, in the receiver circuit in accordance with the embodiment of the present invention, in the case where the voltage level of the buffering signal Bf_s as the output of the buffering unit 10 increases due to a variation in PVT so the driving force of the pull-down operation of the driving unit 20 becomes larger than the driving force of the pull-up operation of the driving unit 20, the voltage level of the control signal ctrl is lowered so the compensation unit 200 decreases the pull-down driving force of the driving unit 20. Therefore, since the driving unit 20 has the pull-up driving force and the pull-down driving force of the same magnitude, the output signal OUT of the receiver circuit in accordance with the embodiment of the present invention may have normal duty, that is, a normal slew rate.

Thus, in the receiver circuit in accordance with the embodiment of the present invention, the duty of an output signal with respect to an input signal, that is, a slew rate may be constantly maintained regardless of a variation in PVT.

Figure 4:
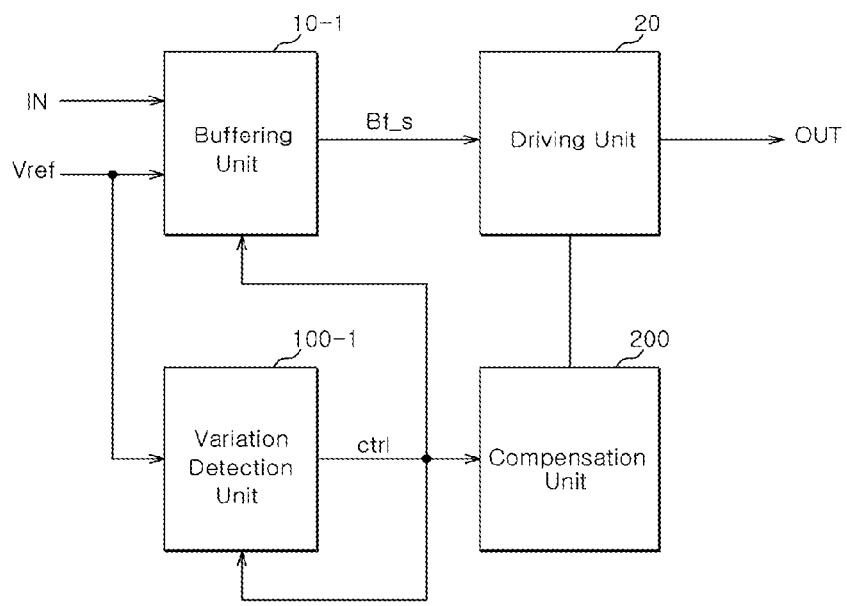
FIG. 4 is a configuration diagram of a receiver circuit in accordance with another embodiment of the present invention.

FIG. 4 is a configuration diagram of a receiver circuit in accordance with another embodiment of the present invention.

The receiver circuit of FIG. 4 is distinguished from the receiver circuit of FIG. 2 in that the control signal ctrl is inputted to a buffering unit 10-1. The buffering unit 10-1 of FIG. 4 is configured in a similar way as the modeling buffering section 110 of FIG. 3 except that the gate of a transistor N23 which constitutes the modeling buffering section 110 of FIG. 3 is inputted with the control signal ctrl.

The other operations of the aforementioned embodiment and the present embodiment of the invention are the same. Since a pull-up driving force and a pull-down driving force which are used by the buffering unit 10-1 to output the buffering signal Bf_s become the same by the control signal ctrl, the driving unit 20 drives the output signal OUT with a pull-up driving force and a pull-down driving force with the same magnitude.

As a consequence, the present embodiment of the invention may implement precise duty correction in comparison with the aforementioned embodiment of the invention.

Figure 5:
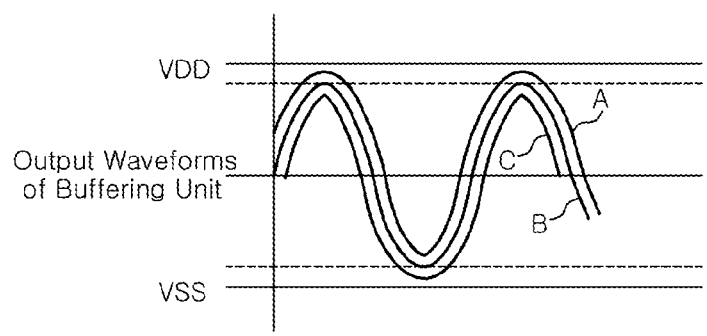
FIG. 5 is of graphs showing output waveforms of a buffering unit and a driving unit.
Figure 5:
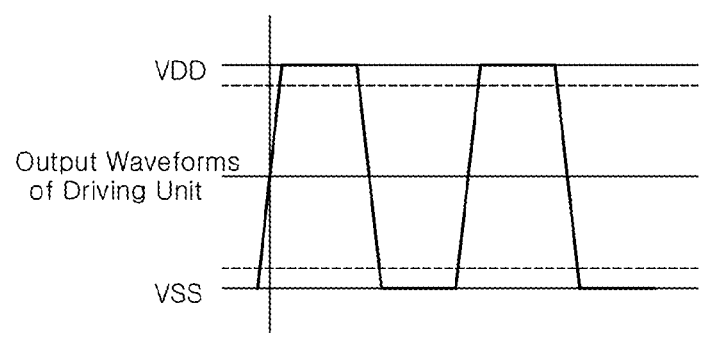

Referring to FIG. 5, in the embodiments of the present invention, even when the level of the output of the buffering unit changes due to a variation in PVT (process, voltage and temperature) (see the cases A and C), the same output of the driving unit as in the case (see the case B) where the level of the output of the buffering unit is normal may be acquired. The case A represents the case in which the level of the output of the buffering unit increases due to a variation in PVT, and the case C represents the case in which the level of the output of the buffering unit decreases due to a variation in PVT.

While certain embodiments have been described above, it will be understood to those skilled in the art that the embodiments is described are by way of example only. Accordingly, the receiver circuit described herein should not be limited based on the described embodiments. Rather, the receiver circuit described herein should only be limited in light of the claims that follow when taken in conjunction with the above description and accompanying drawings.

What is claimed is:

1. A receiver circuit comprising:
   a buffering unit configured to buffer an input signal and generate a buffering signal;
   a variation detection unit configured to generate a control signal according to a level of a reference voltage;
   a driving unit configured to drive the buffering signal and generate an output signal; and
   a compensation unit configured to control a slew rate of the output signal in response to the control signal,
   wherein the buffering unit compares a level of the input signal and the level of the reference voltage, and determines a voltage level of the buffering signal.

2. The receiver circuit according to claim 1, wherein the compensation unit determines an amount of current which flows from the driving unit to a ground terminal, in response to the control signal.

3. The receiver circuit according to claim 2, wherein the driving unit comprises:
   a first transistor having a gate which is inputted with the buffering signal and a source to which the external voltage is applied; and
   a second transistor having a gate which is inputted with the buffering signal, a drain to which a drain of the first transistor is connected, and a source to which the compensation unit is connected,
   wherein the output signal is outputted from a node to which the drains of the first transistor and the second transistor are connected.

4. The receiver circuit according to claim 3, wherein the compensation unit comprises:
   a third transistor having a gate which is inputted with the control signal, a drain to which the source of the second transistor is connected, and a source to which the ground terminal is connected.

5. The receiver circuit according to claim 1, wherein the variation detection unit comprises:
   a modeling buffering section configured to buffer the reference voltage and generate a detection signal;
   a voltage dividing section configured to divide an external voltage and output a divided voltage; and a comparing section configured to compare a voltage level of the detection signal and a level of the divided voltage and generate the control signal.

6. The receiver circuit according to claim 5, wherein the modeling buffering section is configured in a similar way as the buffering unit.

7. The receiver circuit according to claim 5, wherein the modeling buffering section generates the detection signal in correspondence to a level difference between the reference voltage and a ground voltage.

8. The receiver circuit according to claim 6, wherein the modeling buffering section comprises:
   a fourth transistor having a source to which the external voltage is applied;
   a fifth transistor having a gate and drain to which the gate of the fourth transistor is connected, and a source to which the external voltage is applied;
   a sixth transistor having a gate which is applied with the reference voltage and a drain to which the drain of the fourth transistor is connected;
   a seventh transistor having a gate to which the ground voltage is applied and a drain to which the drain of the fifth transistor is connected; and
   an eighth transistor having a gate to which an enable signal is inputted, a drain to which a node connected with the sources of the sixth and seventh transistors is connected, and a source to which the ground voltage is applied,
   wherein the detection signal is outputted from a note to which the drains of the fourth and sixth transistors are connected.

9. The receiver circuit according to claim 6, wherein the modeling buffering section comprises:
   a fourth transistor having a source to which the external voltage is applied;
   a fifth transistor having a gate and drain to which the gate of the fourth transistor is connected, and a source to which the external voltage is applied;
   a sixth transistor having a gate which is applied with the reference voltage and a drain to which the drain of the fourth transistor is connected;
   a seventh transistor having a gate to which the ground voltage is applied and a drain to which the drain of the fifth transistor is connected; and
   an eighth transistor having a gate to which an the control signal is inputted, a drain to which a node connected with the sources of the sixth and seventh transistors is connected, and a source to which the ground voltage is applied,
   wherein the detection signal is outputted from a note to which the drains of the fourth and sixth transistors are connected.

10. A receiver circuit comprising:
    a buffering unit configured to buffer an input signal of a CML (current mode logic) level and generate a buffering signal;
    a driving unit configured to drive the buffering signal and generate an output signal of a CMOS (complementary metal-oxide semiconductor) level; and
    a variation compensation block having a modeling buffering section which is configured in a similar way as the buffering unit, and configured to increase or decrease a slew rate of the output signal in response to an output of the modeling buffering section,
    wherein the buffering unit generates the buffering signal by comparing a level of a reference voltage and a voltage level of the input signal.

11. The receiver circuit according to claim 10, wherein the variation compensation block comprises:
    a variation detection unit configured to compare a level of the output of the modeling buffering section and a level of an external voltage, and generate a control signal; and
    a compensation unit configured to increase or decrease an amount of current which flows from the driving unit to a ground terminal, in response to the control signal.

12. The receiver circuit according to claim 11, wherein the variation detection unit comprises:
    the modeling buffering section configured to compare the level of the reference voltage and a level of a ground voltage, and generate a detection signal;
    a voltage dividing section configured to voltage-divide the external voltage and generate a divided voltage; and
    a comparing section configured to compare a voltage level of the detection signal and the level of the external voltage, and generate the control signal.

13. The receiver circuit according to claim 10, wherein the driving unit comprises:
    a first transistor having a gate which is inputted with the buffering signal and a source to which the external voltage is applied; and
    a second transistor having a gate which is inputted with the buffering signal, a drain to which a drain of the first transistor is connected, and a source to which the compensation unit is connected,
    wherein the output signal is outputted from a node to which the drains of the first transistor and the second transistor are connected.

14. The receiver circuit according to claim 13, wherein the compensation unit comprises:
    a third transistor having a gate which is inputted with the control signal, a drain to which the source of the second transistor is connected, and a source to which the ground terminal is connected.

15. A receiver circuit comprising:
    a buffering unit configured to buffer an input signal and generate a buffering signal;
    a driving unit configured to pull down an output node when a voltage level of the buffering signal is equal to or higher than a preset voltage level, and pull up the output node when the voltage level of the buffering signal is equal to or lower than the preset voltage level; and
    a variation compensation block having a modeling buffering section which is configured in a similar way as the buffering unit, and configured to control a pull-down driving force of the output node in response to an output of the modeling buffering section,
    wherein the buffering unit generates the buffering signal by comparing a level of a reference voltage and a voltage level of the input signal.

16. The receiver circuit according to claim 15, wherein the driving unit comprises:
    a pull-up section configured to pull up the output node in response to the voltage level of the buffering signal; and
    a pull-down section configured to pull down the output node in response to the voltage level of the buffering signal.

17. The receiver circuit according to claim 16, wherein the variation compensation block comprises:
    a variation detection unit configured to generate a control signal in response to a voltage level difference between a reference voltage and a ground voltage; and
    a compensation unit configured to control a pull-down driving force of the pull-down section in response to the control signal.

18. The receiver circuit according to claim 17, wherein the compensation unit comprises:
- a transistor configured to control an amount of current which flows from the pull-down section to a ground terminal, in response to the control signal,
- wherein the transistor has a gate which is inputted with the control signal, a drain to which the pull-down section is connected, and a source to which the ground terminal is connected.

* * * * *